United States Patent [19]

Salour et al.

[11] Patent Number: 4,998,803

[45] Date of Patent: Mar. 12, 1991

[54] MOUNTING STRUCTURE FOR OPTICAL AND ELECTRO-OPTICAL COMPONENTS AND METHOD OF MAKING SAME

[75] Inventors: Michael M. Salour, La Jolla; James H. Bechtel, San Diego, both of Calif.

[73] Assignee: Tacan Corporation, Carlsbad, Calif.

[21] Appl. No.: 337,338

[22] Filed: Apr. 13, 1989

[51] Int. Cl.⁵ .................................................. G02B 6/12
[52] U.S. Cl. .................................... 350/321; 350/320; 350/96.11
[58] Field of Search ................. 350/321, 96.11, 336, 350/320, 96.16, 19, 51, 82

[56] References Cited

U.S. PATENT DOCUMENTS

| | | | |
|---|---|---|---|
| 4,789,214 | 12/1988 | Vilhelmsson et al. | 350/96.11 |
| 4,809,058 | 2/1989 | Funamoto et al. | 357/82 |
| 4,904,036 | 2/1990 | Blonder | 350/96.11 |
| 4,917,466 | 4/1990 | Nakamura et al. | 350/336 |
| 4,933,262 | 6/1990 | Beguin | 350/96.11 |

OTHER PUBLICATIONS

Conant et al., "GaAs Laser Diode Pumped Nd:YAG Laser," Applied Optics, vol. 13, No. 11, pp. 2457–2458 (Nov. 74).
Tuckerman, et al., "High–Performance Heat Sinking for VLSI," IEEE Electron Device Letters, vol. EDL-2, No. 5, pp. 126–129 (May 81).
Kawachi, et al., "Guided–Wave . . . Channel Waveguides," Electronics Letters, vol. 21, No. 8, pp. 314–315 (Apr. 85).
Harriott, et al., "Micromachining of Integrated Optical Structures,"0 Appl. Phys. Lett., vol. 48, No. 25, pp. 1704–1705 (Jun. 86).
Harnagel, et al., "Ultra–High Power . . . Conversion Efficiency," Electronics Letters, vol. 23, No. 14, pp. 743–744 (Jul. 87).
Cross, et al., "Ultrahigh–Power . . . Laser Arrays," Science, vol. 237, pp. 1305–1309 (Sep. 87).
Chung, et al., "Milled–Groove . . . Waveguide Couplers," Journal of Lighwave Tech., vol. LT-5, No. 12, pp. 1721–1726 (Dec. 87).
Yamada, et al., "Single–Mode . . . Guiding Groove," Journal of Lighwave Tech., vol. LT-5, No. 12, pp. 1716–1720 (Dec. 87).
Welch, et al., "High–Power . . . Diode Array," Electronics Letters, vol. 24, No. 2, pp. 113–115 (Jan. 88).

*Primary Examiner*—Bruce Y. Arnold
*Assistant Examiner*—James Phan
*Attorney, Agent, or Firm*—Baker, Maxham, Jester & Meador

[57] ABSTRACT

Apparatus for mounting optical and electro-optical components and the like to a substrate to obtain physical mounting and electrical connections, along with heat dissipation. A relief pattern of precisely dimensioned grooves is formed on a substrate surface and the components are mounted in those grooves. The grooves may be partially lined with electrode material to facilitate electrical interconnection between the components and the substrate. The invention also relates to the method of mounting and interconnection.

68 Claims, 3 Drawing Sheets

MOUNTING STRUCTURE FOR OPTICAL AND ELECTRO-OPTICAL COMPONENTS AND METHOD OF MAKING SAME

FIELD OF THE INVENTION

This invention relates generally to mounting of optical and electro-optical components, either active or passive devices such as diode lasers, light emitting diodes, fiber optic connectors, fiber optic couplers, multiplexers or other components to achieve proper positioning, stability, cooling and electrical connection, and more particularly concerns a simple method and apparatus for providing proper mounting of such devices.

BACKGROUND OF THE INVENTION

Micro devices, either active or passive components, such as light emitting diodes (LED's), laser diodes, phototransistors, photodiode detectors, fiber optic connectors, fiber optic multiplexers, fiber optic couplers and other individual elements or arrays of such optical or electro-optical components have been available and have certain precision physical requirements for enabling their use in a convenient way. Prior devices have addressed themselves primarily to the solution of the problems of electrical connection or of thermal conductivity to prevent excessive temperature rise in the component, or to other particular purposes. Many devices have been put forth which offer solutions to some or all of these problems, often in a relatively expensive or complex manner.

The basic requirements for use of many such micro electro-optical or optical devices are that the device be positioned accurately on a substrate, that it be mechanically secured to the substrate, it may require electrical connections for forward biasing and, if required, for modulation, and that it be in thermal contact with an appropriate heat sink to prevent undesired and excessive temperature rise in the component during use.

SUMMARY OF THE INVENTION

Broadly speaking, this invention satisfies all of the requirements for practical use of micro-chip size optical and electro-optical devices in a very simple and convenient structure.

More specifically, a substrate with a relief pattern of grooves and lands thereon very simply and precisely aligns and holds micro devices Additionally it electrically connects and thermally sinks the active devices. The electrodes on the sides of the electro-optical device make contact in a press fit configuration with confronting electrodes at the sides of the grooves on the substrate. Alternatively, the electrodes may be soldered to the relief pattern electrodes. For passive devices the mounting method will align and hold the device even if no electrical connections are needed.

Alternative embodiments are disclosed which indicate that the method of this invention may be used to create two- or three- dimensional arrays of optical and electro-optical devices on a substrate. Different means are provided for electrically connecting devices to the substrate. Additionally, mounting means for active electro-optical devices and beam deflectors are also disclosed. Further, means for actively removing the heat from the substrate on which are mounted active devices are included.

BRIEF DESCRIPTION OF THE DRAWING

The objects, advantages and features of this invention will be more readily perceived from the following detailed description, when read in conjunction with the accompanying drawing, in which.

DETAILED DESCRIPTION OF THE PREFERRED EMBODIMENTS

The term "optical or electro-optical component" will be used herein to refer to any of the optical or electro-optical devices which may be connected to the substrate in accordance with this invention. Alternatively, the terms "device" or "component" may be used. Such devices may be light emitting diodes (LED's), phototransistors and photodiode detectors, among others.

Although many of the illustrations of the manner in which this technology may be used for micro device mounting are given with reference to optoelectronic components such as diode lasers or photodetectors, this mounting technology is not limited to these components. Active devices such as optical transmitters, receivers and modulators, passive devices such as optical multiplexers or demultiplexers, or both, may be used. In addition, this technology is not restricted to individual elements on a substrate. Also contemplated is a groove-within-a-groove to give precise control of one micro element above another, for example, a lens above a diode laser or a lens above a photodetector.

Figure 1:
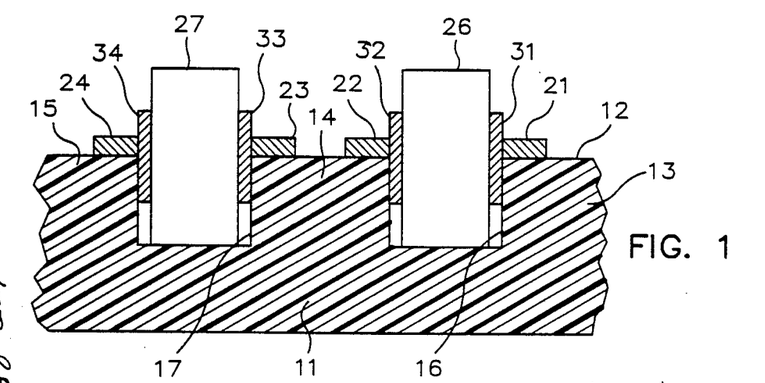
FIG. 1 is a partial cross-section of a substrate with optical or electro-optical components, such as laser diodes, mounted therein.

With reference now to the drawing and more particularly to FIG. 1 thereof, there is shown substrate 11 having top surface 12 and a relief pattern formed of lands 13, 14 and 15 defining grooves 16 and 17 therein. On the lands defining the top edges of the grooves are formed electrodes 21 and 22 flanking groove 16 and electrodes 23 and 24 flanking groove 17. These electrodes are formed in a conventional manner such as by vapor deposition or by any other suitable means. Although one embodiment contemplates the lands and grooves to be unitarily formed from a monolithic substrate, it is possible that a different material may be used for the lands which thereby form the grooves.

A device such as a diode laser or photodetector 26, having electrodes 31 and 32 on opposite sides thereof, is mounted in groove 16. Typically the device would be press fit into the groove whereby relatively rigid electrodes 31 and 32 would be in an interference fit with relatively deformable electrodes 21 and 22, thereby not only providing positive, secure mounting but also electrical connection as well. One of electrodes 21 and 22 is common or ground while the other one provides a bias or an appropriate signal, such as for modulation purposes. Similarly, electrodes 33 and 34 of device 27 make electrical and physical contact in groove 17 with respective electrodes 23 and 24 at the shoulders of the groove. It should be noted that the grooves may be formed by suitable means such as sawing, etching or milling the substrate in a precise manner to provide accurate control of the width and depth of the spacing between lands. Of course, that spacing comprises the grooves.

Figure 2:
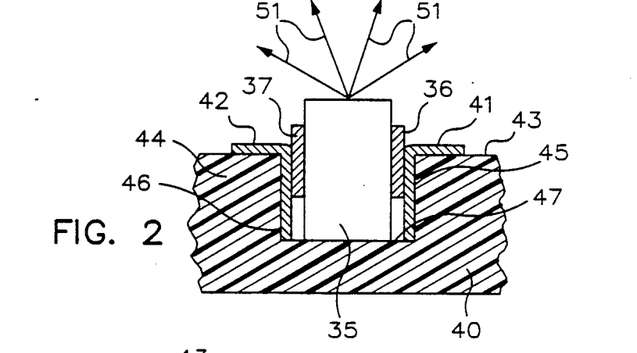
FIG. 2 shows an alternative arrangement for electrical interconnection.

An alternative embodiment for the physical and electrical connection for vertical mounting of a micro device is shown in FIG. 2. In the same manner as shown in FIG. 1, electrodes 41 and 42 are formed not only on top of lands 43 and 44 respectively of substrate 40, but also down along the sides 45 and 46 of groove 47. Thus device 35, having side electrodes 36 and 37, makes firm physical and positive electrical contact with the electrodes formed in juxtaposition with the grooves.

Figures 3, 4:
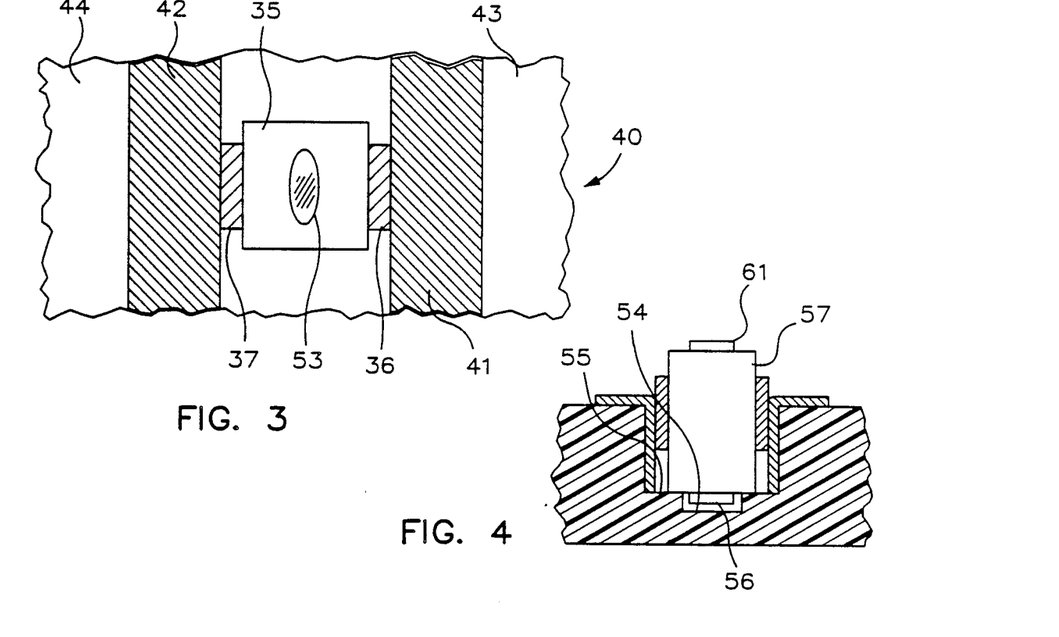
FIG. 3 is a top view of the arrangement of FIG. 2.
FIG. 4 shows an alternative embodiment similar to FIG. 2 for a diode laser component mounted in a groove in the substrate.

With the orientation of a micro device such as a diode laser as shown in FIGS. 1 and 2 the laser emission would be directed generally outwardly from the substrate and top diode surfaces as shown by arrows 51. FIG. 3 is a top view of the structure of FIG. 2, showing active region 53 for laser emission from diode laser 35.

It should be noted that the relief pattern on the substrate may be fashioned to accommodate either vertical or horizontal mounting of the devices.

Another vertical mounting embodiment with reference to a diode laser component is shown in FIG. 4. A somewhat more complex relief pattern is provided where additional sub-groove 54 is formed in the bottom of main groove 55 to accommodate mirror 56 on the bottom of diode laser component 57. Mirror 61 is typically located on the opposite end. The physical and electrical interconnection mounting of FIG. 4 is the same as the FIG. 2 embodiment. In this arrangement, the bottom mirror, non-reflective coating or natural facet reflectivity of the semiconductor, which is important for operation of a diode laser, is protected from hitting the bottom of the substrate by the inclusion of additional shallow groove 54. It should be noted that the mirror need not actually protrude from the lower end of the diode laser, but in any event the bottom additional groove can be provided for protection of that surface.

Figure 5:
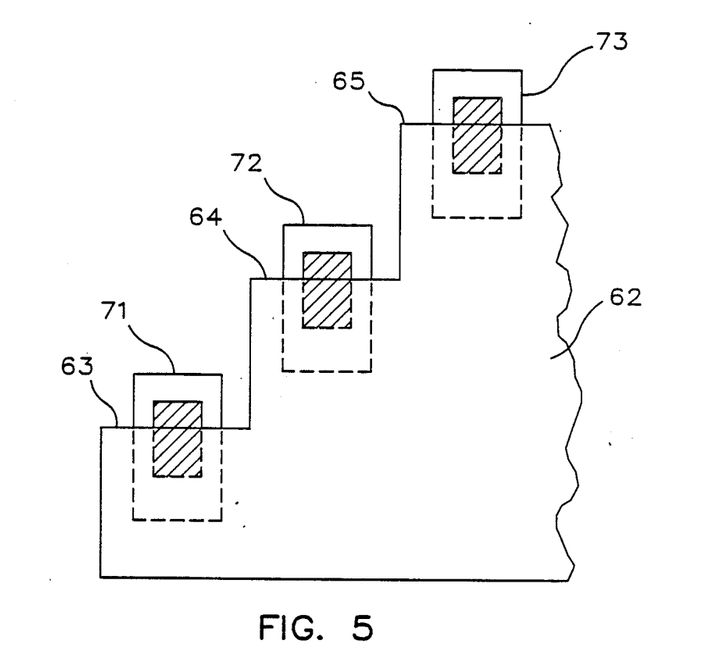
FIG. 5 is an end view showing a three-dimensional stair step arrangement for mounting optical or electro-optical components.
Figure 6:
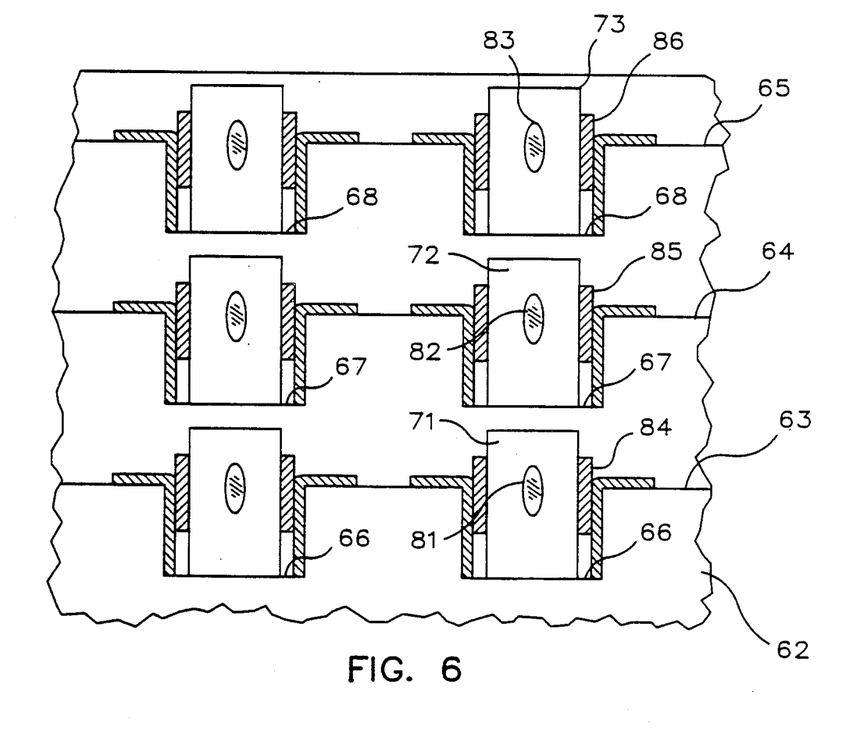
FIG. 6 is a partial front view of the structure of FIG. 5.

A three dimensional stair-step arrangement is shown in FIGS. 5 and 6 where a horizontal mounting of the optical or electro-optical component is disclosed. Substrate 62 is formed with, in this case, three different flat surfaces 63, 64 and 65 which are arranged in a stair-step pattern. Etched into each of these flat surfaces are grooves 66, 67 and 68, two of each of which are shown. It should be understood that any number of such steps and grooves can be provided. Optical or electro-optical components 71, 72 and 73 are mounted in these grooves in the manner shown in FIG. 2. For example, if the devices are diode lasers, then the active regions for laser emission, 81, 82 and 83 respectively, are shown in the horizontal orientation in FIG. 6. Device electrodes 84, 85 and 86 are shown in FIGS. 5 and 6 on respective components 71, 72 and 73.

Figure 7:
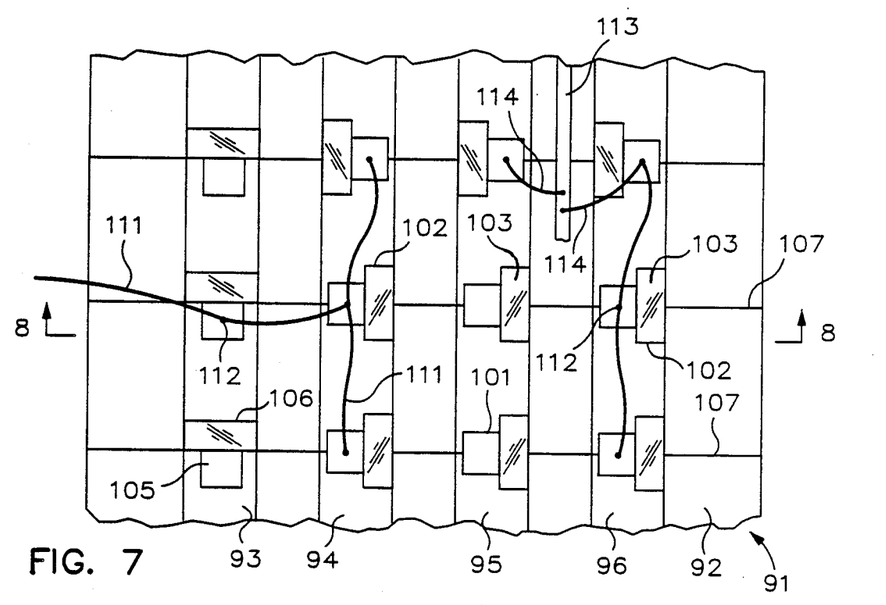
FIG. 7 is a top, somewhat schematic, view of optical or electro-optical components with beam deflectors, shown in different orientations.
Figure 8:
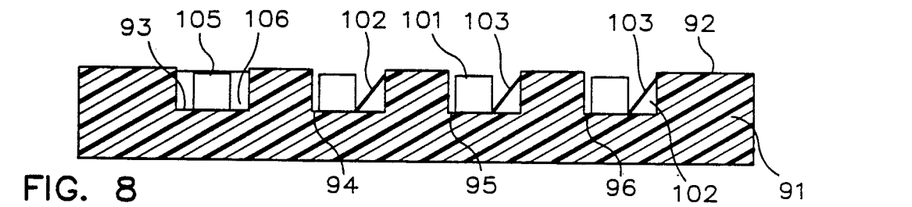
FIG. 8 is a sectional view through cutting plane 8—8 of FIG. 7.

Another arrangement for horizontal mounting is shown in FIGS. 7 and 8 where each optical or electro-optical device is mounted in a groove with a mating beam deflector to direct the light originating in the device in a direction normal to the surface of the substrate. More specifically, substrate 91 having upper surface 92 is formed with a plurality of grooves 93, 94, 95 and 96. In grooves 94, 95 and 96 are optical or electro-optical devices 101 having their optical axes perpendicular to the longitudinal axes of the grooves and parallel to the bottom groove surface. Beam deflectors 102 may be mounted in the groove with the device as a separate element or they may be formed in a unitary manner when the grooves are formed in substrate 91. It is only necessary that the beam deflectors have reflective surface 103. The sloping side of the groove which forms the beam deflector can be formed in the same manner as the straight side of the groove. Then it is possible by polishing, or by surface coating, to create the desired reflective surface. Alternatively, diffusion, ion implantation or ion exchange of a suitable doping material into the sloping surface of the substrate could be employed to provide the reflective surface if desired. It is contemplated that the bottom surface of grooves 93, 94, 95 and 96 would be coated with a metallic conductive path to which one of the device electrodes would be connected if electrodes are needed for the device.

An alternative arrangement is shown in groove 93 of substrate 91 where the optical or electro-optical component 105 and beam deflector 106 elements are shown in pairs at a 90° angle with respect to those shown in the other grooves. The optical axis of the component remains parallel to the groove surface and is aligned with the longitudinal direction or axis of the groove. This is a matter of choice for any particular purpose and does not require any further description. However, with this orientation, it would be normally be expected that the beam deflectors would be separate elements.

Lines 107 arranged in the top surface of the substrate are V-grooves provided for alignment of the optical or electro-optical components and the corresponding beam deflectors. These are optional but can be useful in assembling the substrate with the components. Another alternative is that if the beam deflectors are formed in the sides of the groove, they would be continuous and the components would be aligned with the V-grooves.

In the embodiment of FIGS. 7 and 8, if electrodes are required, the second electrode of selected components could be electrically interconnected by wire bonding 111 to top surface 112 where the second electrode would be exposed. It is contemplated that signal bus 113 could be selectively provided as an electrically conductive path along the lands between the grooves and wires 114 bonded between that path and each component electrode. Alternatively, separate signal wires could be provided to each component if necessary.

Figure 9:
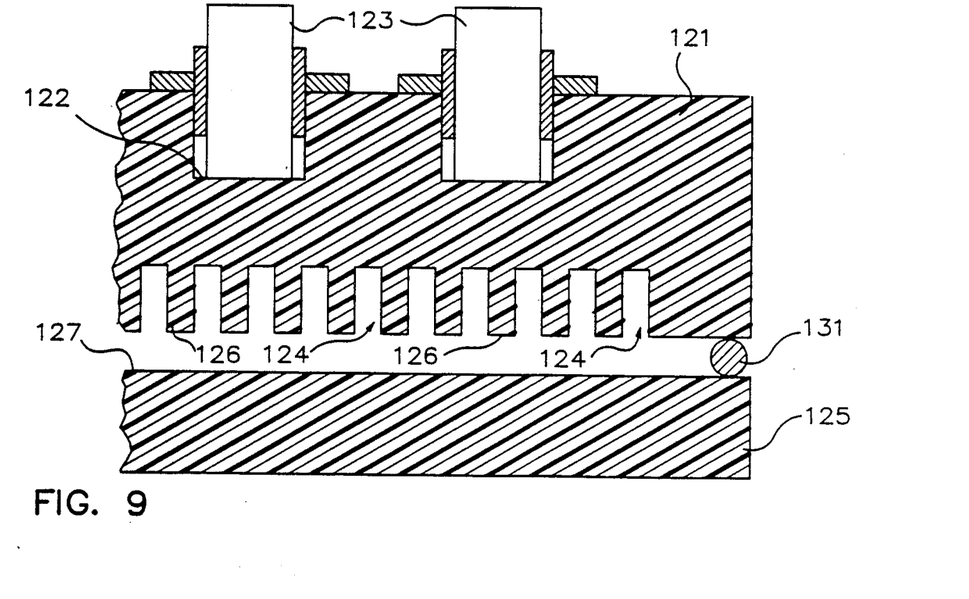
FIG. 9 is a partial sectional view through a substrate with an active cooling structure.

With respect to FIG. 9, it is seen how the technology of forming the relief pattern can also be used for forming convective cooling channels in the substrate. Substrate 121 is formed with grooves 122 in the top in which laser diodes 123 are mounted. Grooves 124 may be formed in the opposite side of substrate 121 which can accommodate a cooling fluid of any type. A plate 125 is positioned either in contact with lands 126 forming the bottom surface of substrate 121 or spaced therefrom as shown in the drawing. The space, or reservoir, between top surface 127 and lands 126 is formed by an 0-ring 131 which seals the periphery of the reservoir. Cooling fluid may be pumped through this reservoir and groove combination to provide cooling for the active components mounted to the other side of the thermally conductive substrate.

For reference purposes, it may be stated that the material from which the substrate is formed may preferably be silicon or it could be sapphire or other suitable material. For active components, the basic characteristics of the substrate are that it be electrically non-conductive but be a good thermal conductor. These materials provide such characteristics. It is also noted that while discrete components are shown mounted in grooves in the substrate, monolithic arrays of components may be also advantageously mounted in such a relief pattern on a substrate. For example, a two-dimensional array could be formed by an array of linear diode laser arrays or linear photodiode arrays. Additionally, while both component electrodes are shown connected to opposite sides of the groove in FIGS. 1-6, it is possible that it would be desired to make such a connection in the groove to only one of the component electrodes. Other means may be provided for the electrical connection, such as the wire bonding mentioned with respect to FIGS. 7 and 8. Also, while it is shown in FIG. 4 that a component has two mirrors, it is possible that there is a mirror on one side and the other side is formed as a non-reflective coating or has a natural facet reflectivity of the material.

In view of the above description, it is apparent that the invention has significant advantages. Individual components or monolithic arrays may be mounted on a substrate to give large-scale arrays. The mounting procedure described above is quick, inexpensive and allows for flexible spacing of the components in the array. Such flexible spacing allows for small size and yet controlled temperature increase by varying the spacing between components or by varying the spacing between the grooves in the substrate surface It has already been noted that the fabrication technology employed to create the relief pattern on the substrate can also be used to create the convective cooling pattern. This type of cooling includes the use of channels or micro-channels in the substrate to remove heat from the substrate. Additionally, heat pipes could be used, along with liquid metal coolants, or cryogenic cooling of the substrate.

Arrays of diode lasers in the structure of the invention may also be used with external cavities or other devices to phase couple the individual diode lasers into a coherent array. The use of this precision mounting technique will allow the positioning of passive optics relative to the individual components. For applications such as phase locking of diode laser arrays in an external cavity, the precision mounting scheme here greatly facilitates the precise relative placement of the individual diode laser components and the diode laser optics. The relative position of this placement is a critical factor in achieving a uniform phase distribution across the array of diode lasers.

In view of the above description, it is likely that modifications and improvements will occur to those skilled in the art which are within the scope of the appended claims.

What is claimed is:

1. A method for mounting optical or electro-optical components to a substrate, said method comprising the steps of:
    forming a substrate with at least one component receiving surface;
    forming a relief pattern on the substrate component receiving surface, said pattern comprising at least one combination of lands forming at least one groove in the component receiving surface;
    selectively forming electrode means on the substrate for selective electrical connection with the components; and
    mounting at least one optical or electro-optical component in said groove, the component being selectively shaped and configured to make electrical contact with the electrode means when mounted in the groove.

2. A method for mounting optical or electro-optical components to a substrate, said method comprising the steps of:
    forming a substrate with at least one component receiving surface on one side thereof;
    forming a relief pattern on the substrate component receiving surface, said pattern comprising at least one combination of lands forming at least one groove in the component receiving surface;
    forming at least one electrode element on the substrate in selective juxtaposition with the groove therein; and
    mounting at least one optical or electro-optical component in said groove, the component having at least one electrode, said component electrode being in electrical contact with an electrode element on the substrate.

3. The method recited in claim 2, wherein said electrode forming step results in electrodes being formed on the component receiving surface of the lands immediately adjacent the grooves.

4. The method recited in claim 2, wherein said electrode forming step forms electrodes within the grooves.

5. The method recited in claim 2, wherein said electrode forming step forms electrodes along the inside sides of the grooves.

6. The method recited in claim 2, wherein said electrode forming step forms electrodes on the component receiving surface of the lands immediately adjacent the grooves, said electrodes continuing along the inside sides of the grooves.

7. A method for mounting optical or electro-optical component to a substrate, said method comprising the steps of:
    forming a substrate with at least one component receiving surface on one side thereof:
    forming a relief pattern on the substrate component receiving surface, said pattern comprising at least one combination of lands forming at least one groove on the component receiving surface;
    selectively forming a sub-groove at the bottom of the groove to accommodate a reflective surface on the components; and
    mounting at least one optical or electro-optical component in said groove.

8. The method recited in claim and further comprising the step of forming a sub-groove at the bottom of the grooves to accommodate a reflective surface on the components.

9. A method for mounting optical or electro-optical components to a substrate, said method comprising the steps of:
    forming a substrate with several component receiving surfaces arranged in a stair-step fashion on one side thereof;

forming a relief pattern on the substrate component receiving surfaces, said pattern comprising at least one combination of lands forming at least one groove in the component receiving surfaces; and mounting at least one optical or electro-optical component in said grooves.

10. The method recited in claim 2, wherein said component receiving surface forming step results in several such surfaces arranged in a stair-step fashion, each component receiving surface being formed with the relief pattern thereon.

11. The method recited in claim 10, wherein said electrode forming step results in electrodes being formed on the component receiving surface of the lands immediately adjacent the grooves.

12. The method recited in claim 10, wherein said electrode forming step forms electrodes on the component receiving surface of the lands immediately adjacent the grooves, said electrodes continuing along the inside sides of the grooves.

13. A method for mounting optical or electro-optical components to a substrate, said method comprising the steps of:

forming a substrate with at least one component receiving surface on one side thereof;

forming a relief pattern on the substrate component receiving surface, said pattern comprising at least one combination of lands forming at least one groove in the component receiving surface;

mounting at least one optical or electro-optical component in said groove; and forming at least one beam deflector in the groove in optically effective juxtaposition with the component mounted therein.

14. The method recited in claim 2, and comprising the further step of forming at least one beam deflector in the groove in optically effective juxtaposition with the component mounted therein.

15. The method recited in claim 13, and comprising the further step of forming alignment grooves on the component receiving surface for positioning of the optical or electro-optical components.

16. The method recited in claim 14, and comprising the further step of forming alignment grooves on the component receiving surface for positioning of the optical or electro-optical components.

17. A method for mounting optical or electro-optical components to a substrate, said method comprising the steps of:

forming a substrate with at least one component receiving surface on one side thereof;

forming a relief pattern on the substrate component receiving surface, said pattern comprising at least one combination of lands forming at least one groove in the component receiving surface;

mounting at least one optical or electro-optical component in said groove;

forming a second relief pattern on the side of the substrate opposite to the component receiving surface; and forming a reservoir including the second relief pattern through which cooling fluid is adapted to flow.

18. The method recited in claim 2, and comprising the further steps of:

forming a second relief pattern on the side of the substrate opposite to the component receiving surface; and forming a reservoir including the second relief pattern through which cooling fluid is adapted to flow.

19. A method for forming a substrate to which optical or electro-optical components are adapted to be mounted, said method comprising the steps of:

forming a substrate with at least one component receiving surface on one side thereof;

forming a relief pattern on the substrate component receiving surface, said pattern comprising at least one combination of lands forming at least one groove in the component receiving surface; and selectively forming electrode means on the substrate for selective electrical connection with the components;

the components being adapted to be positively mounted to the substrate in conjunction with the lands and groove thereon, and selectively making electrical connection with the electrode means.

20. A method for forming a substrate to which optical or electro-optical components are adapted to be mounted, said method comprising the steps of:

forming a substrate with at least one component receiving surface on one side thereof;

forming a relief pattern on the substrate component receiving surface, said pattern comprising at least one combination of lands forming at least one groove in the component receiving surface; and forming at least one electrode element on said substrate in selective juxtaposition with the groove, the groove and electrode being adapted to physically and electrically connect to an optical or electro-optical component;

the components being adapted to be positively mounted to the substrate in conjunction with the lands and groove thereon.

21. The method recited in claim 20, wherein said electrode forming step results in electrodes being formed on the component receiving surface of the lands immediately adjacent the grooves.

22. The method recited in claim 20, wherein said electrode forming step forms electrodes within the grooves.

23. The method recited in claim 20, wherein said electrode forming step forms electrodes along the inside sides of the grooves.

24. The method recited in claim 20, wherein said electrode forming step forms electrodes on the component receiving surface of the lands immediately adjacent the grooves, said electrodes continuing along the inside sides of the grooves.

25. A method for forming a substrate to which optical or electro-optical components are adapted to be mounted, said method comprising the steps of:

forming a substrate with at least one component receiving surface on one said thereof;

forming a relief pattern on the substrate component receiving surface, said pattern comprising at least one combination of lands forming at least one groove in the component receiving surface; and forming a sub-groove at the bottom of the groove to accommodate a reflective surface on the components;

the components being positively mounted to the substrate in conjunction with the lands and groove thereon.

26. The method recited in claim 20, and further comprising the step of forming a sub-groove at the bottom of the grooves to accommodate a reflective surface on the components.

27. A method for forming a substrate to which optical or electro-optical components are adapted to be mounted, said method comprising the steps of:
   forming a substrate with several component receiving surfaces arranged in a stair-step fashion on one side thereof;
   forming a relief pattern on the substrate component receiving surfaces, said pattern comprising at least one combination of lands forming at least one groove in the component receiving surfaces; and
   mounting at least one optical or electro-optical component in said grooves.

28. The method recited in claim 17, wherein said component receiving surface forming step results in several such surfaces arranged in a stair-step fashion, each component receiving surface being formed with the relief pattern thereon.

29. A method for forming a substrate to which optical or electro-optical components are adapted to be mounted, said method comprising the steps of:
   forming a substrate with at least one component receiving surface on one side thereof;
   forming a relief pattern on the substrate component receiving surface, said pattern comprising at least one combination of lands forming at least one groove in the component receiving surface;
   mounting at least one optical or electro-optical component in said groove; and
   forming at least one beam deflector in the groove in optically effective juxtaposition with the component mounted therein.

30. The method recited in claim 20, and comprising the further step of forming at least one beam deflector in the groove in optically effective juxtaposition with the optical or electro-optical component mounted therein.

31. A method for forming a substrate to which optical or electro-optical components are adapted to be mounted, said method comprising the steps of:
   forming a substrate with at least one component receiving surface on one side thereof;
   forming a relief pattern on the substrate component receiving surface, said pattern comprising at least one combination of lands forming at least one groove in the component receiving surface;
   mounting at least one optical or electro-optical component in said groove; and
   forming at least one beam deflector in the groove in optically effective juxtaposition with the component mounted therein.

32. The method recited in claim 17, and comprising the further step of mounting at least one beam deflector in the groove in optically effective juxtaposition with the optical or electro-optical component mounted therein.

33. The method recited in claim 31, and comprising the further step of forming alignment grooves on the component receiving surface for positioning of the optical or electro-optical components.

34. The method recited in claim 32, and comprising the further step of forming alignment grooves on the component receiving surface for positioning of the optical or electro-optical components.

35. A method for forming a substrate to which optical or electro-optical components are adapted to be mounted, said method comprising the steps of:
   forming a substrate with at least one component receiving surface on one side thereof;
   forming a relief pattern on the substrate component receiving surface, said pattern comprising at least one combination of lands forming at least one groove in the component receiving surface;
   mounting at least one optical or electro-optical component in said groove;
   forming a second relief pattern on the side of the substrate opposite to the component receiving surface; and
   forming a reservoir including the second relief pattern through which cooling fluid is adapted to flow.

36. The method recited in claim 17, and comprising the further steps of:
   forming a second relief pattern on the side of the substrate opposite to the component receiving surface; and
   forming a reservoir including the second relief pattern through which cooling fluid is adapted to flow.

37. Apparatus for mounting electro-optical components, said apparatus comprising:
   a substrate having a component receiving surface on one side thereof;
   a relief pattern of lands and grooves formed on said component receiving surface;
   electrode means on said substrate adapted to selectively make electrical contact with the components; and
   at least one optical or electro-optical component mounted in said grooves and selectively making electrical connection with said electrode means.

38. Apparatus for mounting electro-optical components, said apparatus comprising:
   a substrate having a component receiving surface on one side thereof;
   a relief pattern of lands and grooves formed on said component receiving surface;
   electrode means formed on said substrate in selective juxtaposition with at least one of said grooves; and
   at least one optical or electro-optical component mounted in said groove and having at least one electrode, said component electrode being in electrical contact with said electrode means on said substrate.

39. The apparatus recited in claim 38, wherein said substrate electrode is located on one of said lands immediately adjacent one of said grooves.

40. The apparatus recited in claim 38, wherein said substrate electrode is located at least partially within one of said grooves.

41. The apparatus recited in claim 38, wherein said substrate electrode is formed along the inside sides of said groove.

42. The apparatus recited in claim 38, wherein said substrate electrode extends along said component receiving surface adjacent said groove and continues along the inside sides of said groove.

43. Apparatus for mounting electro-optical components, said apparatus comprising:
   a substrate having a component receiving surface on one side thereof;
   relief pattern of lands and grooves formed on said component receiving surface, at least one of said grooves being formed with a sub-groove at the bottom of said groove to accommodate a reflective surface on a component; and at least one optical or electro-optical component mounted in said groove.

44. The apparatus recited in claim 38, wherein at least one of said grooves is formed with a sub-groove at the bottom of said groove to accommodate a reflective surface on the component.

45. Apparatus for mounting electro-optical components, said apparatus comprising:

a substrate having a component receiving surface on one side thereof; and relief pattern of lands and grooves formed on said component receiving surface, said component receiving surface comprising several such surfaces arranged in a stair-step fashion, each said component receiving surface being formed with said relief pattern thereon;

at least one optical or electro-optical component mounted in the grooves.

46. The apparatus recited in claim 38, wherein said component receiving surface comprises several such surfaces arranged in a stair-step fashion, each said component receiving surface being formed with said relief pattern thereon.

47. Apparatus for mounting electro-optical components, said apparatus comprising:

a substrate having a component receiving surface on one side thereof;

a relief pattern of lands and grooves formed on said component receiving surface;

at least one optical or electro-optical component mounted in said groove; and a beam deflector in said groove in optically effective relationship with said component.

48. The apparatus recited in claim 38, and further comprising a beam deflector in said groove in optically effective relationship with said component.

49. The apparatus recited in claim 37, and further comprising at least one alignment groove on said component receiving surface to facilitate alignment of said component when being mounted in one of said relief pattern grooves.

50. The apparatus recited in claim 38, and further comprising at least one alignment groove on said component receiving surface to facilitate alignment of said component.

51. Apparatus for mounting electro-optical component, said apparatus comprising:

a substrate having a component receiving surface on one side;

a relief pattern or lands and grooves formed on said component receiving surface;

at least one optical or electro-optical component mounted in said groove;

a second relief pattern on the side of said substrate opposite to said component receiving surface; and means for forming a reservoir including said second relief pattern through which reservoir cooling fluid is adapted to flow.

52. The apparatus recited in claim 38, and further comprising:

a second relief pattern on the side of said substrate opposite to said component receiving surface; and means for forming a reservoir including said second relief pattern through which reservoir cooling fluid is adapted to flow.

53. Apparatus to which optical or electro-optical components are adapted to be mounted, said apparatus comprising:

a substrate have at least one component receiving surface;

a relief pattern of lands and grooves formed on said component receiving surface; and electrode means on said substrate adapted to selectively make electrical contact with the components;

said grooves being adapted to physically connect to an optical or electro-optical component.

54. Apparatus to which optical or electro-optical components are adapted to be mounted, said apparatus comprising:

a substrate having at least one component receiving surface on one side thereof;

a relief pattern on lands and grooves formed on said component receiving surface; and electrode means formed on said substrate in selective juxtaposition with at least one of said grooves;

said grooves being adapted to physically connect to an optical or electro-optical component;

said electrode means being adapted to electrically connect to the optical or electro-optical component.

55. The apparatus recited in claim 54, wherein said substrate electrode is located on one of said lands immediately adjacent one of said grooves.

56. The apparatus recited in claim 54, wherein said substrate electrode is located at least partially within one of said grooves.

57. The apparatus recited in claim 54, wherein said substrate electrode is formed along the inside sides of said groove.

58. The apparatus recited in claim 54, wherein said substrate electrode extends along said component receiving surface adjacent said groove and continues along the inside sides of said groove.

59. Apparatus to which optical or electro-optical components are adapted to be mounted, said apparatus comprising:

a substrate having at least one component receiving surface on one side thereof;

a relief pattern of lands and grooves formed on said component receiving surface; and a sub-groove formed at the bottom of at least one of said grooves to accommodate a reflective surface on a component;

said grooves being adapted to physically connect to an optical or electro-optical component.

60. The apparatus recited in claim 54, wherein at least one of said grooves is formed with a sub-groove at the bottom of said groove to accommodate a reflective surface on the component.

61. Apparatus to which optical or electro-optical components are adapted to be mounted, said apparatus comprising:

a substrate having at least one component receiving surface on one side thereof; and a relief pattern of lands and grooves formed on said component receiving surface;

said component receiving surface comprising several such surfaces arranged in a stair-step fashion, each said component receiving surface being formed with said relief pattern thereon;

said groove being adapted to physically connect to an optical or electro-optical component.

62. The apparatus recited in claim 54, wherein said component receiving surface comprises several such surfaces arranged in a stair-step fashion, each said component receiving surface being formed with said relief pattern thereon.

63. Apparatus to which optical or electro-optical components are adapted to be mounted, said apparatus comprising:
   a substrate having a least one component receiving surface on one side thereof;
   a relief pattern of lands and grooves formed on said component receiving surface;
   said grooves being adapted to physically connect to an optical or electro-optical component; and
   a beam deflector in said grooves in optically reflective relationship with said component.

64. The apparatus recited in claim 54, and further comprising a beam deflector in said groove in optically effective relationship with said component.

65. The apparatus recited in claim 53, and further comprising at least one alignment groove on said component receiving surface to facilitate alignment of said components when said components are being mounted in one of said relief pattern grooves.

66. The apparatus recited in claim 54, and further comprising at least one alignment groove on said component receiving surface to facilitate alignment of said components.

67. Apparatus to which optical or electro-optical components are adapted to be mounted, said apparatus comprising:
   a substrate having at least one component receiving surface on one side thereof;
   a relief pattern of lands and grooves formed on said component receiving surface;
   a second relief pattern on the side of said substrate opposite to said component receiving surface; and
   means for forming a reservoir including said second relief pattern through which reservoir cooling fluid is adapted to flow;
   said grooves on said component receiving surface being adapted to physically connect to an optical or electro-optical component.

68. The apparatus recited in claim 54, and further comprising;
   a second relief pattern on the side of said substrate opposite to said component receiving surface; and
   means for forming a reservoir including said second relief pattern through which reservoir cooling fluid is adapted to flow.

* * * * *